US012604118B2

(12) United States Patent
Lee

(10) Patent No.: US 12,604,118 B2
(45) Date of Patent: Apr. 14, 2026

(54) IMAGE SENSING DEVICE

(71) Applicant: SK hynix Inc., Gyeonggi-do (KR)

(72) Inventor: Eun Chang Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 204 days.

(21) Appl. No.: 18/624,128

(22) Filed: Apr. 2, 2024

(65) Prior Publication Data

US 2025/0126376 A1     Apr. 17, 2025

(30) Foreign Application Priority Data

Oct. 12, 2023     (KR) ........................ 10-2023-0135935

(51) Int. Cl.
| | |
|---|---|
| *H04N 25/78* | (2023.01) |
| *H01L 23/00* | (2006.01) |
| *H04N 25/42* | (2023.01) |
| *H04N 25/59* | (2023.01) |
| *H04N 25/709* | (2023.01) |
| *H04N 25/76* | (2023.01) |
| *H04N 25/771* | (2023.01) |
| *H10F 39/00* | (2025.01) |

(52) U.S. Cl.
CPC ............. *H04N 25/78* (2023.01); *H01L 24/08* (2013.01); *H04N 25/42* (2023.01); *H04N 25/59* (2023.01); *H04N 25/709* (2023.01); *H04N 25/76* (2023.01); *H04N 25/771* (2023.01); *H10F 39/809* (2025.01); *H01L 2224/08145* (2013.01)

(58) Field of Classification Search
CPC ...... H04N 25/42; H04N 25/59; H04N 25/709; H04N 25/771; H04N 25/76; H04N 25/78; H01L 24/08; H01L 2224/08145; H10F 39/809

See application file for complete search history.

(56) References Cited

U.S. PATENT DOCUMENTS 11,711,632 B2 *  7/2023  Choi ....................... H04N 25/78
                                                      348/308
11,722,794 B2 *  8/2023  Innocent ................ H04N 25/57
                                                      348/302

FOREIGN PATENT DOCUMENTS

KR     10-2022-0037930 A     3/2022
KR     10-2022-0112362 A     8/2022

* cited by examiner

*Primary Examiner* — Lin Ye
*Assistant Examiner* — Chriss S Yoder, III
(74) *Attorney, Agent, or Firm* — IP & T GROUP LLP

(57) ABSTRACT

An image sensing device capable of generating a high dynamic range (HDR) image is disclosed. The image sensing device includes a pixel and a compensation circuit. The pixel configured to output to a sensing node, a sensing voltage corresponding to a voltage of a floating diffusion region, which is included therein and has first and second capacitances in respective first and second modes, the second capacitance being greater than the first capacitance. The compensation circuit controls, in a first section, an offset voltage level of the sensing node through a first path and boosts, in a second section, the sensing voltage through a second path.

20 Claims, 8 Drawing Sheets

IMAGE SENSING DEVICE

CROSS-REFERENCE TO RELATED APPLICATION

This patent application claims priority and the benefits of Korean patent application No. 10-2023-0135935, filed on Oct. 12, 2023, which is herein incorporated by reference in its entirety.

TECHNICAL FIELD

Embodiments of the present disclosure generally relate to an image sensing device capable of generating a high dynamic range (HDR) image.

BACKGROUND

An image sensing device is a device for capturing optical images by converting light into electrical signals using a photosensitive semiconductor material which reacts to light. With the development of automotive, medical, computer and communication industries, the demand for high-performance image sensing devices has been increasing in various fields such as smart phones, digital cameras, game machines, IoT (Internet of Things), robots, surveillance cameras and medical micro cameras.

Recently, to provide high-quality images, interest in HDR images is rapidly increasing, and various techniques capable of acquiring HDR images are being developed. Among such techniques, technology for varying a conversion gain of a pixel that detects incident light and converts the incident light into an electrical signal can accurately acquire images for each of high illuminance and low illuminance.

However, according to the technology for varying the conversion gain, different conversion gains are applied to respective pixels, resulting in occurrence of an offset. Additionally, since the technology for varying the conversion gain uses a dual conversion gain (DCG) method, a settling time of a pixel signal output through a readout line may increase.

SUMMARY

In accordance with an embodiment of the present disclosure, an image sensing device may include a pixel configured to output to a sensing node, a sensing voltage corresponding to a voltage of a floating diffusion region, which is included therein and has first and second capacitances in respective first and second modes, the second capacitance being greater than the first capacitance; and a compensation circuit configured to control, in a first section, an offset voltage level of the sensing node through a first path, and boost, in a second section, the sensing voltage through a second path.

In accordance with another embodiment of the present disclosure, an image sensing device may include a pixel configured to output, to a sensing node, a sensing voltage corresponding to a voltage of a floating diffusion region; and a voltage controller configured to control a first current running from the sensing node based on an offset voltage value of the sensing node when a first path is selected in a first section, and boost the first current when a second path is selected in a second section.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
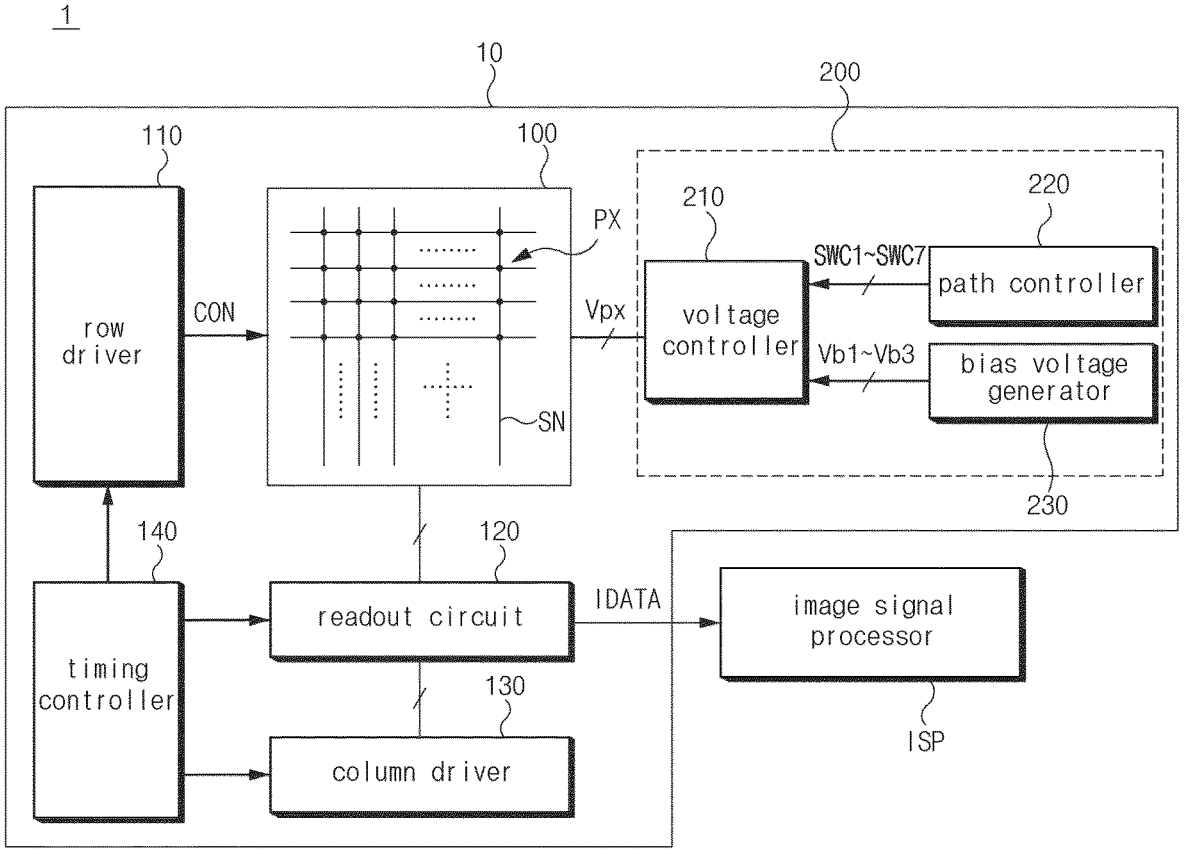
FIG. 1 is a block diagram illustrating an imaging device based on some embodiments of the present disclosure.

Embodiments of the present disclosure provide implementations and examples of an image sensing device capable of generating a high dynamic range (HDR) image that may be used in configurations to substantially address one or more technical or engineering issues and to mitigate limitations or disadvantages encountered in some image sensing devices in the art. Some embodiments of the present disclosure relate to an image sensing device capable of compensating for an offset voltage and reducing a settling time by using a voltage control circuit, a path of which is changed. In recognition of the issues above, the image sensing device based on some embodiments of the present disclosure can compensate for an offset voltage, and can acquire a high dynamic range (HDR) image with a reduced settling time.

Reference will now be made in detail to some embodiments of the present disclosure, which are illustrated in the accompanying drawings. Wherever possible, the same reference numbers will be used throughout the drawings to refer to the same or like parts. While this disclosure is susceptible to various modifications and alternative forms, specific embodiments thereof are shown by way of example in the drawings. However, this disclosure should not be construed as being limited to the embodiments set forth herein.

Hereinafter, various embodiments will be described with reference to the accompanying drawings. However, it should be understood that the disclosed technology is not limited to specific embodiments, but includes various modifications, equivalents and/or alternatives of the embodiments. The embodiments of the present disclosure may provide a variety of effects capable of being directly or indirectly recognized through the disclosed technology.

Various embodiments of the present disclosure relate to an image sensing device capable of compensating for an offset voltage and reducing a settling time by using a voltage control circuit, a path of which is changed.

It is to be understood that both the foregoing general description and the following detailed description of the disclosed technology are illustrative and descriptive and are intended to provide further description of the embodiments of the present disclosure as claimed.

FIG. 1 is a block diagram illustrating an imaging device 1 based on some embodiments of the present disclosure.

Referring to FIG. 1, the imaging device 1 may refer to a device, for example, a digital still camera for photographing still images or a digital video camera for photographing moving images. For example, the imaging device 1 may be implemented as a Digital Single Lens Reflex (DSLR) camera, a mirrorless camera, or a smartphone, and others. The imaging device 1 may include a device having both a lens and an image pickup element such that the device can capture (or photograph) a target object and can thus create an image of the target object.

The imaging device 1 may include an image sensing device 10 and an image signal processor (ISP).

The image sensing device 10 may be a complementary metal oxide semiconductor image sensor (CIS) for converting an incident light into an electrical signal. The image sensing device 10 may include a pixel array 100, a row driver 110, a readout circuit 120, a column driver 130, a timing controller 140, and a compensation circuit 200. The components of the image sensing device 10 illustrated in FIG. 1 are discussed by way of example only, and the present disclosure encompasses numerous other changes, substitutions, variations, alterations, and modifications.

The pixel array 100 may include a plurality of imaging pixels (PXs) consecutively arranged in a two-dimensional (2D) pixel array including rows and columns. The plurality of imaging pixels (PXs) may be consecutively arranged in the column direction and the row direction. In another example, the plurality of imaging pixels (PXs) can be arranged in a three-dimensional (3D) pixel array. The plurality of imaging pixels may convert an optical signal into an electrical signal on a unit pixel basis or a pixel group basis, where pixels in a pixel group share at least certain internal circuitry. A voltage output from a sensing node (SN) of each pixel (PX) may hereinafter be referred to as a sensing voltage ($V_{px}$).

The pixel array 100 may receive pixel control signals (CON), including a row selection signal, a pixel reset signal, a transfer signal, and a dual conversion gain (DCG) control signal from the row driver 110. Upon receiving the pixel control signals (CON), corresponding imaging pixels in the pixel array 100 may be activated to perform the operations corresponding to the row selection signal, the pixel reset signal, the transfer signal, and the DCG control signal. Each of the pixels (PXs) may generate photocharges corresponding to the intensity (or illuminance) of incident light, and may generate an electrical signal having a magnitude corresponding to the amount of generated photocharges, thereby detecting the incident light.

Each pixel (PX) of the pixel array 100 may have at least two different sensitivities. Here, the sensitivity may mean an increase in amount of image data IDATA (or an increase amount of a response) with respect to an increase in amount of the intensity of incident light. That is, as the sensitivity increases, the amount of increase in image data (IDATA) in response to an increase in the intensity of incident light increases. As the sensitivity decreases, the amount of increase in image data (IDATA) in response to an increase in the intensity of incident light decreases. In the present embodiment, sensitivity may be determined by a conversion gain.

The row driver 110 may activate the pixel array 100 to perform certain operations on the imaging pixels in the corresponding row based on commands and control signals provided by controller circuitry such as the timing controller 140. In some embodiments, the row driver 110 may select one or more imaging pixels arranged in one or more rows of the pixel array 100. The row driver 110 may generate a row selection signal to select one or more rows among the plurality of rows.

The row driver 110 may sequentially enable the pixel reset signal for resetting imaging pixels (PXs) corresponding to at least one selected row, and the transfer signal for the pixels (PXs) corresponding to the at least one selected row. Thus, a reference signal and an image signal, which are analog signals generated by each of the imaging pixels (PXs) of the selected row, may be sequentially transferred to the readout circuit 120. The reference signal may be an electrical signal that is provided to the readout circuit 120 when a sensing node of an imaging pixel (e.g., floating diffusion region) is reset, and the image signal may be an electrical signal that is provided to the readout circuit 120 when photocharges generated by the imaging pixel are accumulated in the sensing node. The reference signal indicating unique reset noise of each pixel and the image signal indicating the intensity of incident light may be generically called a pixel signal as necessary.

The image sensing device 10 may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. The primary purpose of CDS is to reduce or eliminate the impact of fixed pattern noise and other sources of offset or drift in the sensor output.

In some embodiments of the present disclosure, the readout circuit 120 may sequentially sample and hold voltage levels of the reference signal and the image signal, which are provided to each of a plurality of column lines from the pixel array 100. That is, the analog-to-digital converter (ADC) included in the readout circuit 120 may sample and hold the pixel signal for each column (i.e., a per-column pixel signal) upon receiving the pixel signal from each column line of the pixel array 100, may convert the resultant signal into digital signals (IDATA), and may output the digital signals (IDATA). In some embodiments, the ADC may be implemented as a ramp-compare type ADC. The ramp-compare type ADC may include a comparator circuit for comparing the analog pixel signal with a ramp signal that ramps up or down according to time, and a timer (or counter) for performing counting until a voltage of the ramp signal matches the analog pixel signal.

The column driver 130 may select a column of the readout circuit 120 upon receiving a control signal from the timing controller 140. The column driver 130 may temporarily store image data (IDATA) for the selected column of the readout circuit 120, and may control the readout circuit 120 to sequentially output the image data (IDATA), which are temporarily stored in the selected column of the readout circuit 120. In some embodiments, upon receiving an address signal from the timing controller 140, the column driver 160 may generate a column selection signal based on the address signal, and may select a column of the readout circuit 120, so that the column driver can temporarily store the image data (IDATA) from the selected column of the readout circuit 120, and can output the stored image data (IDATA) to the outside.

The timing controller 140 may control at least one of the row driver 110, the readout circuit 120, the column driver 130, and the compensation circuit 200. The timing controller 140 may provide at least one of the row driver 110, the readout circuit 120, the column driver 130, and the compensation circuit 200 with a clock signal required for the operations of the respective components of the image sensing device 10, a control signal for timing control, and address signals for selecting a row or column.

The image signal processor (ISP) may perform image processing of image data received from the image sensing device 10. The image signal processor (ISP) may reduce noise of image data and may perform various types of image signal processing (e.g. interpolation, synthesis, gamma correction, color filter array interpolation, color matrix, color correction, color enhancement, lens distortion correction, etc.) for image-quality improvement of the image data.

In addition, the image signal processor (ISP) may compress image data that has been created by execution of image signal processing for image-quality improvement, such that the image signal processor (ISP) can create an image file using the compressed image data. Alternatively, the image signal processor (ISP) may recover image data from the image file. In this case, the scheme for compressing such image data may be a reversible format or an irreversible format. As a representative example of such compression format, in the case of using a still image, Joint Photographic Experts Group (JPEG) format, JPEG 2000 format, or the like can be used. In addition, in the case of using moving images, a plurality of frames can be compressed according to Moving Picture Experts Group (MPEG) standards such that moving image files can be created. For example, the image files may be created according to Exchangeable image file format (Exif) standards.

The image signal processor (ISP) may generate an HDR image by synthesizing at least two images having different sensitivities. For example, the image sensing device 10 may output a low-sensitivity image generated by a pixel (i.e., a low conversion gain pixel) having a relatively lower sensitivity and a high-sensitivity image generated by a pixel (i.e., a high conversion gain pixel) having a relatively higher sensitivity. The image signal processor (ISP) may combine the low-sensitivity image and the high-sensitivity image, resulting in formation of an HDR image. Here, the low-sensitivity and the high-sensitivity may correspond to relative concepts, the image sensing device 10 may generate image data (IDATA) having at least N different sensitivities (where N is an integer of 2 or more), and the image sensing processor (ISP) may generate the HDR image using the resultant image data (IDATA).

The image signal processor (ISP) may transmit the ISP image data to a host device (not shown). The host device (not shown) may be a processor (e.g. an application processor) for processing the ISP image data received from the image signal processor (ISP), a memory (e.g. a non-volatile memory) for storing the ISP image data, or a display device (e.g. a liquid crystal display (LCD)) for visually displaying the ISP image data.

In addition, the image signal processor (ISP) may transmit a control signal for controlling operations (e.g. whether or not to operate, an operation timing, an operation mode, etc.) of the image sensing device 10 to the image sensing device 10.

On the other hand, the compensation circuit 200 may compensate for an offset voltage or a settling time for each pixel (PX) of the pixel array 100. The compensation circuit 200 may include a voltage controller 210, a path controller 220, and a bias voltage generator 230.

To obtain a high dynamic range (HDR) image, technology for varying a conversion gain of pixels may be used.

Technology for varying the conversion gain may include a dual conversion gain (DCG) transistor (to be described later) to control capacitance of a floating diffusion region. However, during a switching operation of the DCG transistor, an offset voltage may occur to change capacitance of a floating diffusion region, so that the sensing voltage ($V_{px}$) may also change in response to such changing capacitance.

Accordingly, the compensation circuit 200 based on some embodiments of the present disclosure may compensate for an offset level of the sensing voltage ($V_{px}$) through the voltage controller 210. In addition, the compensation circuit 200 may reduce the settling time by quickly boosting the compensated sensing voltage ($V_{px}$). The compensation circuit 200 based on some embodiments of the present disclosure may not separately configure a circuit for compensating the offset level and a circuit for reducing the settling time, but may be implemented as one voltage controller 210, and may control the offset level or perform a boosting operation by changing one path to another.

Although the voltage controller 210 is illustrated as being provided separately in the compensation circuit 200 for convenience of description, other embodiments are also possible, and it should be noted that the voltage controller may be located within the pixel array 100 and the scope of the position at which the voltage controller 210 to be disposed is not limited thereto.

The voltage controller 210 may control a voltage of a sensing node (SN) for each unit pixel (PX) based on a plurality of switching control signals (SWC1~SWC7 to be described later) and a plurality of bias voltages (Vb1~Vb3 to be described later). The voltage controller 210 may select a path for adjusting an offset or a path for compensating a settling time based on the plurality of switching control signals. The voltage controller 210 may compensate for an offset voltage of the sensing node (SN) when the offset adjustment path (also referred to as a 'first path') is selected. In addition, the voltage controller 210 may reduce the settling time of the sensing node (SN) when a settling time compensation path (also referred to as a 'second path') is selected.

When the offset voltage is compensated as in an embodiment of the present disclosure, a decrease in the input range may be prevented in a low voltage situation, and the influence of the offset voltage to be differently applied to each pixel (PX) may be reduced. Additionally, when boosting the sensing voltage ($V_{px}$) as in an embodiment of the present disclosure, the settling time can also be reduced.

The path controller 220 may selectively control a plurality of switching control signals to select one of the offset adjustment path and the settling time compensation path. The path controller 220 may be controlled by the timing controller 140. Although the path controller 220 is shown as being separately provided in the compensation circuit 200 for convenience of description, other embodiments are also possible, and it should be noted that the path controller 220 may be located in the timing controller 140, and the scope of the position at which the path controller 220 can be disposed is not limited thereto.

The bias voltage generator 230 may generate a bias voltage to control operation of the voltage controller 210. The bias voltage generator 230 may be controlled by the timing controller 140. Although the bias voltage generator 230 is shown as being separately provided in the compensation circuit 200 for convenience of description, other embodiments are also possible, and it should be noted that the bias voltage generator 230 may be located in the timing controller 140, and the scope of the position at which the bias voltage generator 230 to be disposed is not limited thereto.

A detailed circuit and operation of the compensation circuit 200 including the above-described constituent elements will be described later with reference to FIGS. 3 to 7 to be described later.

Figure 2:
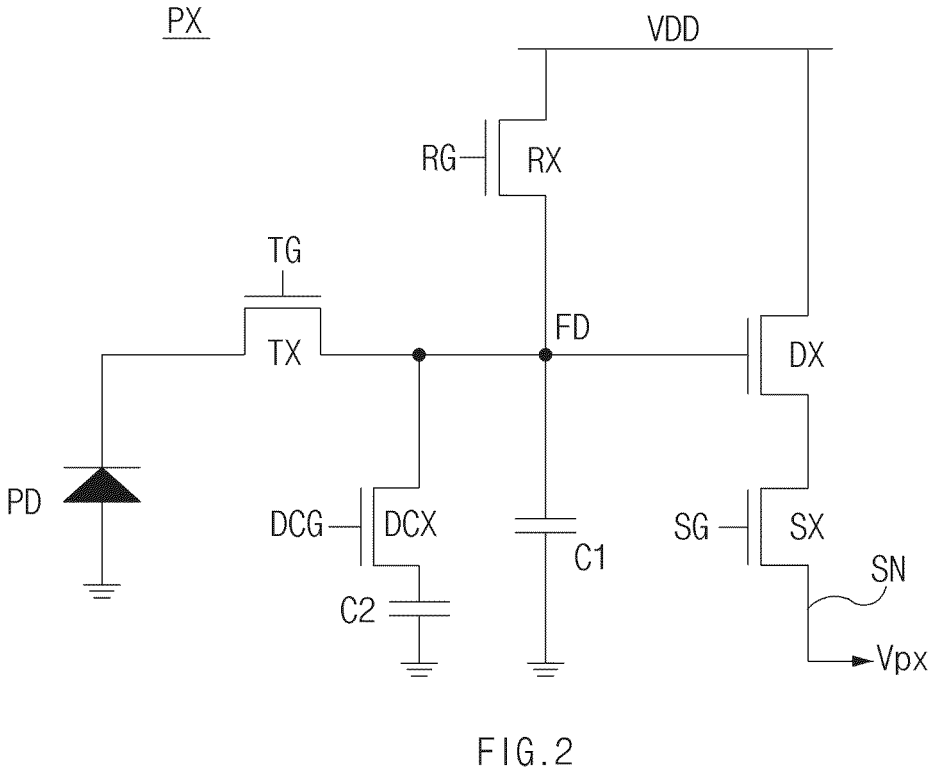
FIG. 2 is a detailed circuit diagram illustrating a unit pixel of the image sensing device shown in FIG. 1 based on some embodiments of the present disclosure.

FIG. 2 is a detailed circuit diagram illustrating a unit pixel (PX) of the image sensing device 10 shown in FIG. 1 based on some embodiments of the present disclosure.

Referring to FIG. 2, the pixel (PX) may be one of a plurality of pixels included in the pixel array 100. Although FIG. 2 shows only one pixel (PX) for convenience of description, other embodiments are also possible, and it should be noted that other pixels may also have substantially the same structure and operation as those of the pixel (PX).

The pixel (PX) may include a photoelectric conversion element (PD), a transfer transistor (TX), a reset transistor (RX), a floating diffusion region (FD), a dual conversion gain (DCG) transistor (DCX), a source follower transistor (DX), a selection transistor (SX), and a plurality of capacitors (C1, C2). Although the pixel (PX) of FIG. 2 is illustrated as including only one photoelectric conversion element (PD) for convenience of description, other embodiments are also possible. Alternatively, the pixel (PX) of FIG. 2 may also be implemented as a shared pixel including a plurality of photoelectric conversion elements. In this case, a plurality of transfer transistors may be provided to correspond to a plurality of photoelectric conversion elements.

The photoelectric conversion element (PD) may generate and accumulate photocharges corresponding to the intensity of incident light through photoelectric conversion of the incident light. For example, the photoelectric conversion element (PD) may be implemented as a photodiode, a phototransistor, a photogate, a pinned photodiode or a combination thereof.

When the photoelectric conversion element (PD) is implemented as a photodiode, the photoelectric conversion element (PD) may be a region doped with impurities of a second conductivity type (e.g., N-type) in a substrate having a first conductivity type (e.g., P-type).

The transfer transistor (TX) may be connected between the photoelectric conversion element (PD) and the floating diffusion region (FD). The transfer transistor (TX) may be turned on or off in response to a transfer signal (TG), and the turned-on transfer transistor (TX) may transfer photocharges accumulated in the photoelectric conversion element (PD) to the floating diffusion region (FD).

The reset transistor (RX) may be connected between the power-supply voltage (VDD) and the floating diffusion region (FD). The reset transistor (RX) may reset a voltage of the floating diffusion region (FD) to the power-supply voltage (VDD) in response to a pixel reset signal (RG).

The floating diffusion region (FD) may accumulate photocharges received from the transfer transistor (TX). The floating diffusion region (FD) can be coupled to the capacitor (C1) connected to a ground terminal. For example, the floating diffusion region (FD) may be a region that is doped with second conductive impurities (e.g., N-type impurities) in a substrate (e.g., a P-type substrate) including first conductive impurities. In this case, the substrate and the impurity doped region can be modeled as the capacitor (C1) acting as a junction capacitor. The floating diffusion region (FD) may be connected to a gate of the source follower transistor (DX).

The DCG transistor (DCX) may be coupled between the floating diffusion region (FD) and the capacitor (C2). The DCG transistor (DCX) may selectively connect the capacitor (C2) to the floating diffusion region (FD) in response to a DCG control signal (DCG).

The capacitor (C1) may be connected between the floating diffusion region (FD) and the ground voltage input terminal. Additionally, the capacitor (C2) may be connected between the DCG transistor (DCX) and the ground voltage input terminal.

Each of the capacitors (C1, C2) may include at least one of a Metal-Insulator-Metal (MIM) capacitor, a Metal-Insulator-Polysilicon (MIP) capacitor, a Metal-Oxide-Semiconductor (MOS) capacitor, and a junction capacitor. When the DCG transistor (DCX) is turned off, the floating diffusion region (FD) may have electrostatic capacity (or the first electrostatic capacity) corresponding to capacitance of the capacitor (C1). When the DCG transistor (DCX) is turned on, the floating diffusion region (FD) may have capacitance corresponding to the sum of capacitance of the capacitor (C1) and capacitance of the capacitor (C2). That is, the DCG transistor (DCX) may control capacitance of the floating diffusion region (FD), thereby controlling a conversion gain of the pixel (PX).

As the DCG control signal (DCG) has a logic high level, the pixel (PX) in a state in which the DCG transistor (DCX) is turned on may operate in a low conversion gain (LCG) mode in which photocharges are converted into electrical signals with a relatively low conversion gain. As the DCG control signal (DCG) has a logic low level, the pixel (PX) in a state in which the DCG transistor (DCX) is turned off may operate in a high conversion gain (HCG) mode in which photocharges are converted into electrical signals with a relatively high conversion gain.

In some embodiments, a logic high level may mean a voltage level for activating (e.g., turning on) a corresponding element (e.g., a transistor), and a logic low level may mean a voltage level for deactivating (e.g., turning off) a corresponding element (e.g., a transistor).

Although FIG. 2 shows a case in which only one DCG transistor (DCX) is used for convenience of description, other embodiments are also possible, and a plurality of DCG transistors can also be used as needed. In this case, capacitance of the floating diffusion region (FD) may have a wider variety of values (e.g., three or more values).

Although the DCG transistor (DCX) according to the present embodiment is connected between the floating diffusion region (FD) and the capacitor (C2) for convenience of description, other embodiments are also possible, and it should be noted that a connection structure of the DCG transistor (DCX) and the capacitors (C1, C2) can be sufficiently changed without departing from the scope or spirit of the present disclosure.

The source follower transistor (DX) may be connected between the power-supply voltage (VDD) input terminal and the selection transistor (SX). The source follower transistor (DX) may amplify a change in electrical potential of the floating diffusion region (FD) that has received photocharges accumulated in the photoelectric conversion element (PD), and may transmit the amplified result to the selection transistor (SX).

The selection transistor (SX) may be connected between the source follower transistor (DX) and the sensing node (SN), and may be turned on by a selection control signal (SG), so that the selection transistor (SX) can output the electrical signal received from the source follower transistor (DX) as a pixel signal (i.e., a pixel voltage $V_{px}$).

Figure 3:
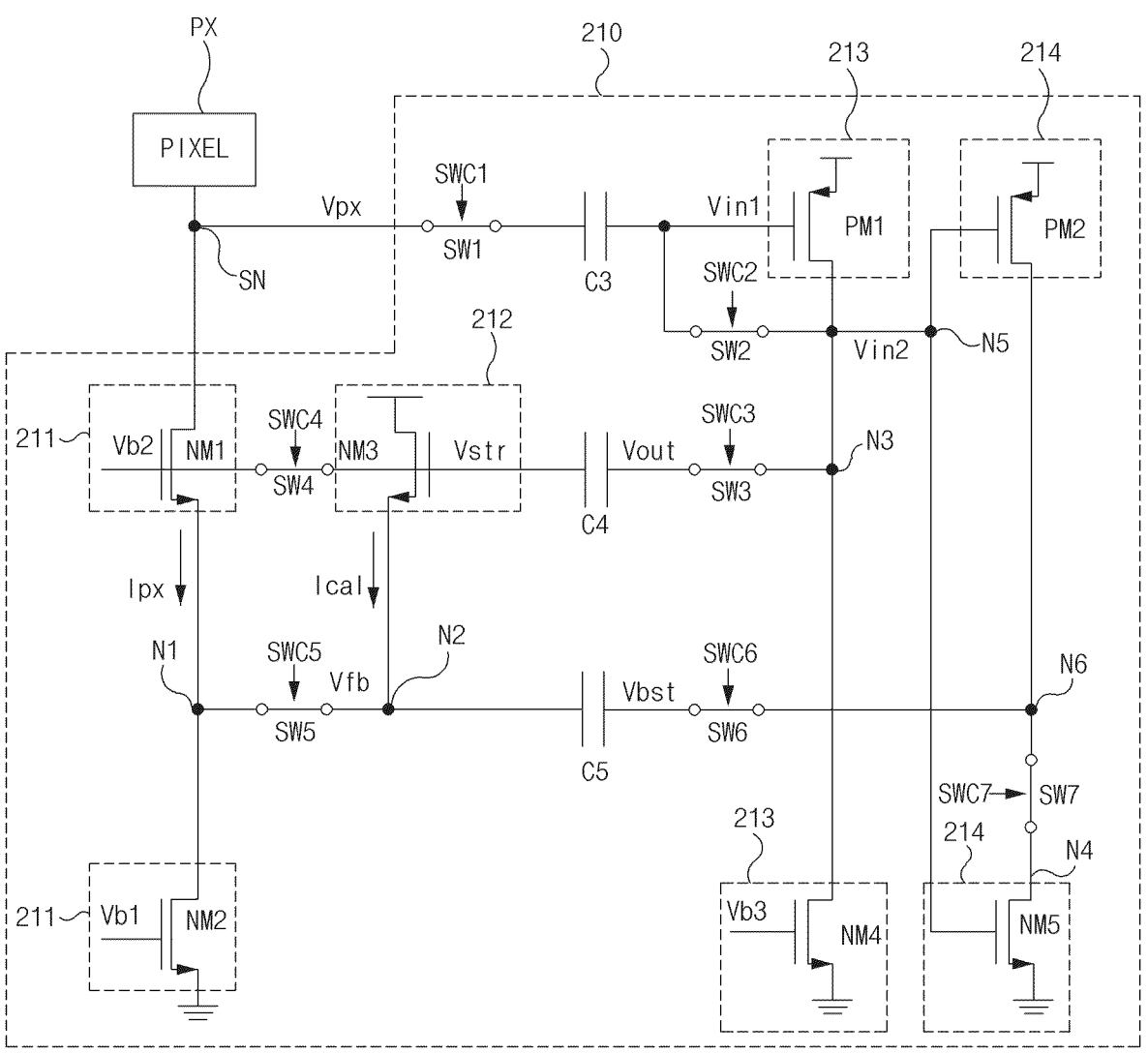
FIG. 3 is a detailed circuit diagram illustrating a voltage controller shown in FIG. 1 based on some embodiments of the present disclosure.

FIG. 3 is a detailed circuit diagram illustrating the voltage controller 210 shown in FIG. 1 based on some embodiments of the present disclosure.

Referring to FIG. 3, the voltage controller 210 may be connected to the sensing node (SN) shown in FIGS. 1 and 2. The voltage controller 210 may control the level of the sensing voltage ($V_{px}$) of the sensing node (SN) in response to a selected path.

The voltage controller 210 may include a bias controller 211, a current adjuster 212, a drive controller 213, a boosting controller 214, a plurality of switching elements (SW1~SW7), and a plurality of capacitors (C3~C5).

The bias controller 211 may control a current ($I_{px}$) running from the sensing node (SN) based on the bias voltages ($V_{b1}$, $V_{b2}$). The bias controller 211 may include a plurality of transistors (NM1, NM2). In this case, the transistors (NM1, NM2) may be NMOS transistors. The transistor NM1 may be connected between the sensing node (SN) and a node (N1), and may receive the bias voltage ($V_{b2}$) through a gate terminal thereof. The transistor (NM2) may be connected between the node N1 and the ground voltage input terminal to receive the bias voltage ($V_{b1}$) through a gate terminal thereof.

The current adjuster 212 may control a current ($I_{cal}$) running to a node (N2) based on a control voltage ($V_{str}$). The current adjuster 212 may include a transistor (NM3). Here, the transistor (NM3) may be an NMOS transistor. The transistor (NM3) may be connected between the power-supply voltage input terminal and the node (N2) to receive the control voltage ($V_{str}$) through a gate terminal thereof.

The drive controller 213 may amplify the change in the sensing voltage ($V_{px}$) based on an input voltage ($V_{in1}$) and may provide the amplified voltage ($V_{px}$) to a node (N3). Additionally, the drive controller 213 may control a current of the node (N3) based on the bias voltage ($V_{b3}$). The drive controller 213 may include a transistor (PM1) and a transistor (NM4). Here, the transistor (PM1) may be a PMOS transistor, and the transistor (NM4) may be an NMOS transistor. Alternatively, the transistor (PM1) may also be implemented as an NMOS transistor.

The transistor (PM1) may be connected between the power-supply voltage input terminal and the node (N3) to receive the input voltage ($V_{in1}$) through a gate terminal thereof. Additionally, the transistor (NM4) may be connected between the node (N3) and the ground voltage input terminal to receive the bias voltage ($V_{b3}$) through a gate terminal thereof.

In addition, the boosting controller 214 may control a boosting signal ($V_{bst}$) based on an input voltage ($V_{in2}$). The boosting controller 214 may include a transistor (PM2) and a transistor (NM5). Here, the transistor (PM2) may be a PMOS transistor, and the transistor (NM5) may be an NMOS transistor. Alternatively, the transistor (PM2) may also be implemented as an NMOS transistor.

The transistor (PM2) may be connected between the power-supply voltage input terminal and the node (N6) to receive the input voltage ($V_{in2}$) through a gate terminal thereof. The transistor (NM5) may be connected between a node (N4) and the ground voltage input terminal to receive the input voltage ($V_{in2}$) through a gate terminal thereof. Each of the transistor (PM2) and the transistor (NM5) may output the boosting signal ($V_{bst}$) through a common drain terminal (i.e., the node N6).

In addition, the switching element (SW1) may be connected between the sensing node (SN) and a capacitor (C3) so that the switching operation thereof can be operable according to the switching control signal (SWC1). When the switching element (SW1) is turned on, the compensation circuit 200 can operate. The switching element (SW2) may be connected between the capacitor (C3) and the node (N3) so that the switching operation thereof can be operable according to a switching control signal (SWC2). The switching element (SW3) may be connected between the capacitor (C4) and the node (N3) so that the switching operation thereof can be operable according to the switching control signal (SWC3).

The switching element (SW4) may be connected between the gate terminal of the transistor (NM1) and the gate terminal of the transistor (NM3), so that the switching operation thereof can be operable according to a switching control signal (SWC4). The switching element (SW5) may be connected between the node (N1) and the node (N2) so that the switching operation thereof can be operable according to a switching control signal (SWC5). The switching element (SW6) may be connected between the capacitor (C5) and the node (N6), and the switching operation thereof can be operable according to a switching control signal (SWC6). The switching element (SW7) may be connected between the node (N6) and the node (N4) so that the switching operation thereof can be operable according to a switching control signal (SWC7).

The capacitor (C3) may be connected between the switching element (SW1) and the gate terminal of the transistor (PM1). A capacitor (C4) may be connected between the gate terminal of the transistor (NM3) and the switching element (SW3). A capacitor (C5) may be connected between the node (N2) and the switching element (SW6).

The operation of the voltage controller 210 including the above-described constituent elements will be described later with reference to FIG. 7 to be described later.

Figure 4:
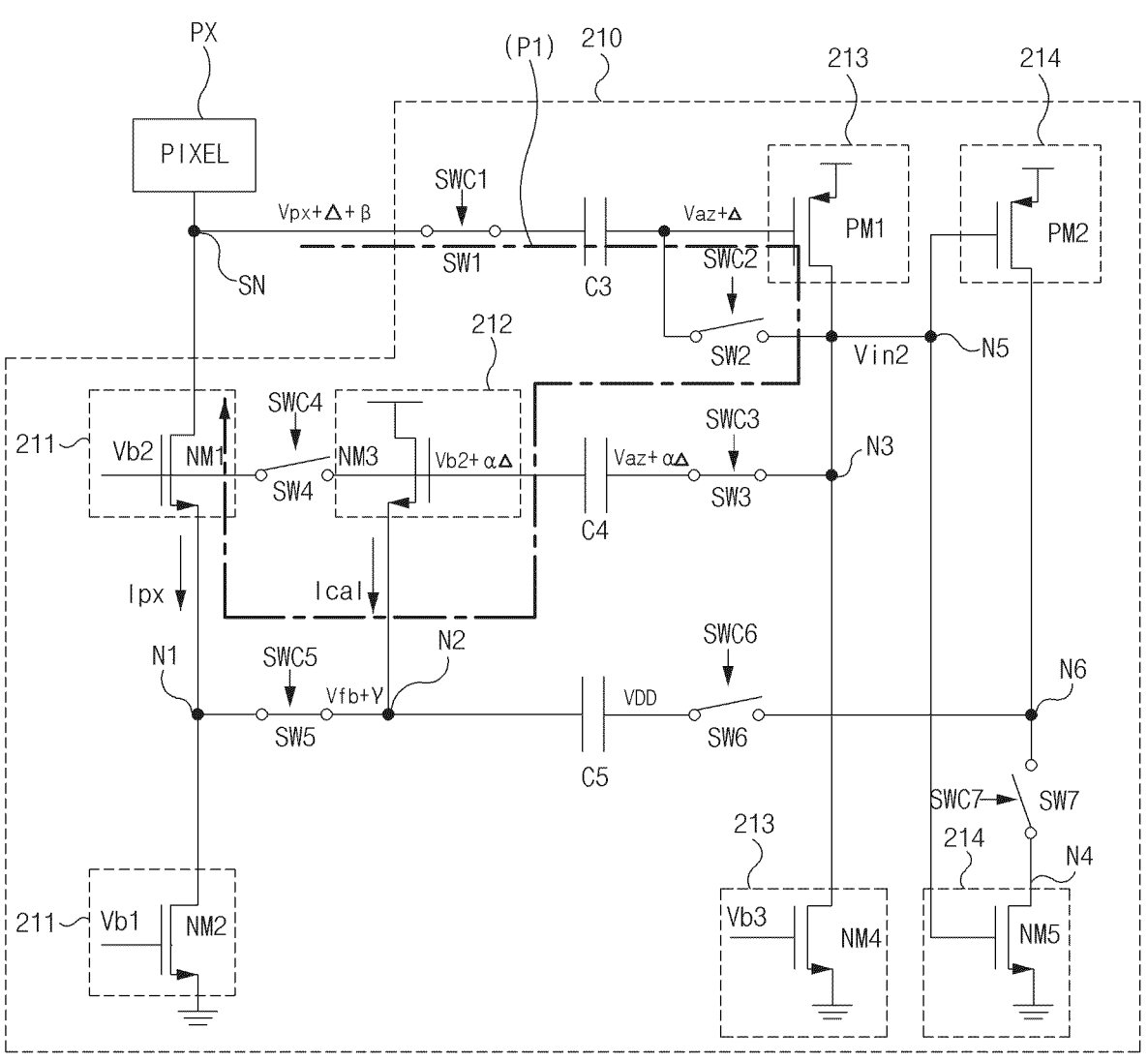
FIGS. 4 and 5 are detailed circuit diagrams illustrating a control path of the voltage controller shown in FIG. 2 based on some embodiments of the present disclosure.
Figure 5:
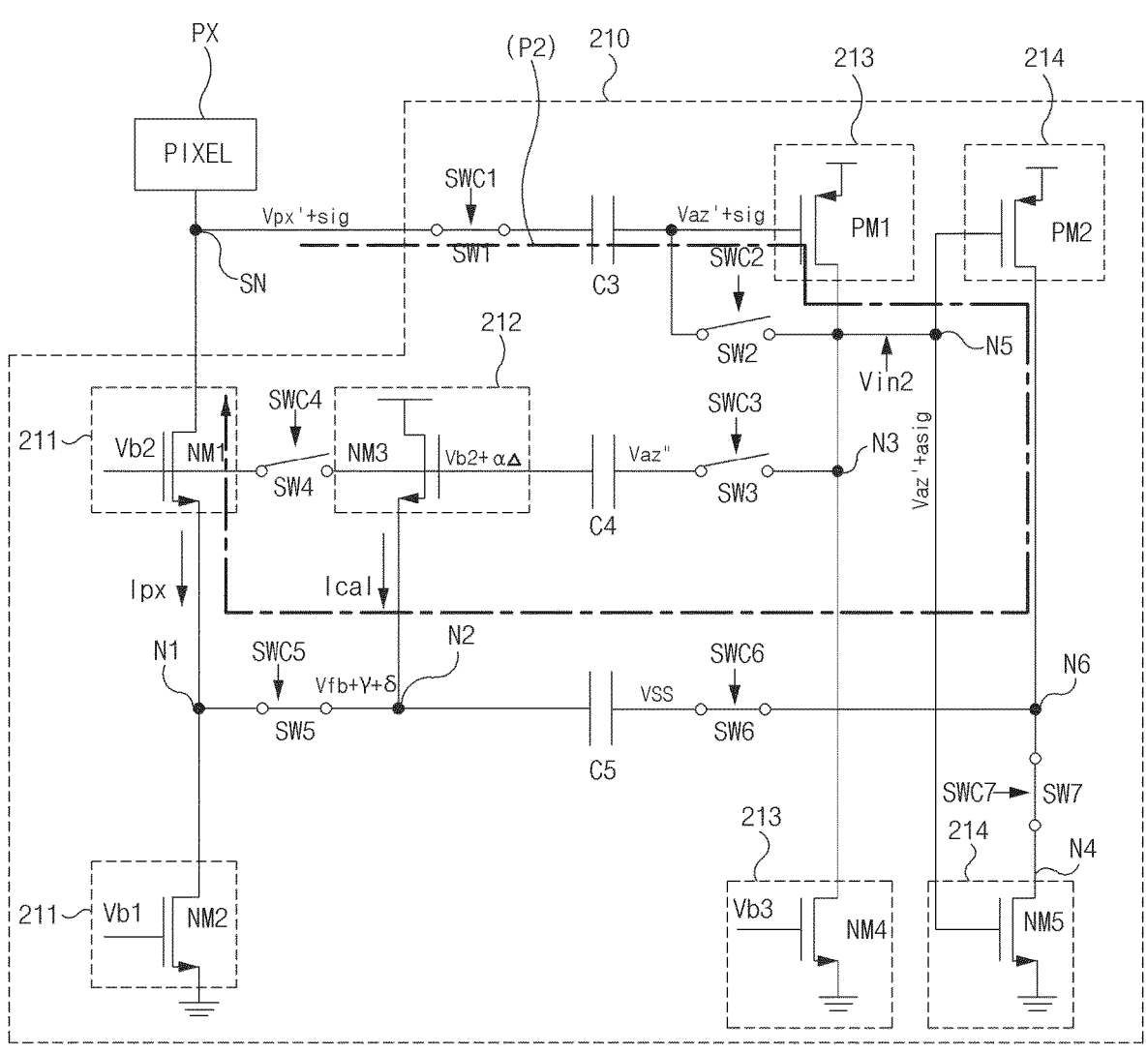

FIGS. 4 and 5 are detailed circuit diagrams illustrating a control path of the voltage controller 210 shown in FIG. 2 based on some embodiments of the present disclosure. FIG. 4 is a detailed circuit diagram illustrating operations of the voltage controller 210 configured to compensate for the offset voltage of the sensing node (SN) when an offset adjustment path (P1) is selected. FIG. 5 is a detailed circuit diagram illustrating operations of the voltage controller 210 configured to compensate for the settling voltage of the sensing node (SN) when a settling time compensation path (P2) is selected.

Referring to FIG. 4, when the offset adjustment path (P1) is selected, the switching elements (SW1, SW3, SW5) of the voltage controller 210 are turned on and the switching elements (SW2, SW4, SW6, SW7) of the voltage controller 210 are turned off.

The source follower transistor (DX) may receive a voltage of the floating diffusion region (FD) through a gate terminal thereof, and may output the sensing voltage ($V_{px}$) corresponding to a gain of the source follower transistor (DX) through a source terminal thereof. The change in the sensing voltage ($V_{px}$) that is output to the sensing node (SN) of the pixel (PX) may have a voltage value ($V_{px}+\Delta+\beta$) including the offset voltage ($\Delta$).

When the switching element (SW1) is turned on, the input voltage ($V_{in}$) to be applied to the gate terminal of the transistor (PM1) may have a voltage value ($V_{az}+\Delta$) including an auto-zeroing voltage ($V_{az}$). The transistor (PM1) may output, to the node N3, the amplified voltage value ($V_{az}+\alpha\Delta$) based on the input voltage ($V_{in}$).

When the switching element (SW3) is turned on, a drive voltage ($V_{out}$) applied to the capacitor (C4) through the node (N3) may have a voltage value ($V_{az}+\alpha\Delta$). When the switching element (SW4) is turned off, the control voltage ($V_{str}$) to be applied to the gate terminal of the transistor (NM3) may have a voltage value ($V_{b2}+\alpha\Delta$). The transistor (NM3) may adjust the current ($I_{cal}$) by the control voltage ($V_{str}$).

A feedback voltage ($V_{fb}$) to be applied to the node (N2) may have a voltage value ($V_{fb}+\gamma$). When the switching element (SW5) is turned on, the voltage of the node (N1) (i.e., the current $I_{px}$ running to the node (N1)) may be adjusted by the feedback voltage ($V_{fb}$). Accordingly, when the current ($I_{px}$) is adjusted in the offset adjustment path (A), the offset voltage level of the sensing voltage ($V_{px}$) of the sensing node (SN) can be adjusted.

Referring to FIG. 5, when the settling time compensation path (P2) is selected, the switching elements (SW1, SW5, SW6, SW7) of the voltage controller 210 are turned on, and the switching elements (SW2, SW3, SW4) of the voltage controller 210 may be turned off.

When the switching element (SW1) is turned on, the sensing voltage ($V_{px}$) (i.e., $V_{px}$+sig, where 'sig' corresponds to a voltage value of the image signal) that is output to the sensing node (SN) of the pixel (PX) may be applied to the gate terminal of the transistor (PM1). The transistor (PM1) may output, based on the input voltage ($V_{az}$+sig) applied to the gate terminal thereof, an amplified voltage value ($V_{az}$+$\alpha$sig) to the node (N5). Here, the amplified voltage ($V_{az}$+$\alpha$sig) may have a level higher than the input voltage ($V_{az}$+sig) by a value of a.

When the switching element (SW3) is turned off and the switching elements (SW6, SW7) are turned on, the transistors (PM2, NM5) can operate by the voltage of the node (N5). When the input voltage ($V_{in2}$) received through each of the gate terminals of the transistors (PM2, NM5) exceeds a threshold voltage, current may flow in the node (N6). Then, the voltage (i.e., a feedback voltage ($V_{fb}$) ($V_{fb}+\gamma\delta$)) of the nodes (N1, N2) acting as the source terminals of the transistors (NM1, NM3) may rapidly drop. Accordingly, the value of the current (Ipx) may momentarily increase significantly and the level of the sensing voltage (Vpx) of the sensing node (SN) may be boosted.

The operation of the voltage controller 210 having such a path will be described in more detail with reference to FIGS. 6 and 7 to be described later.

Figure 6:
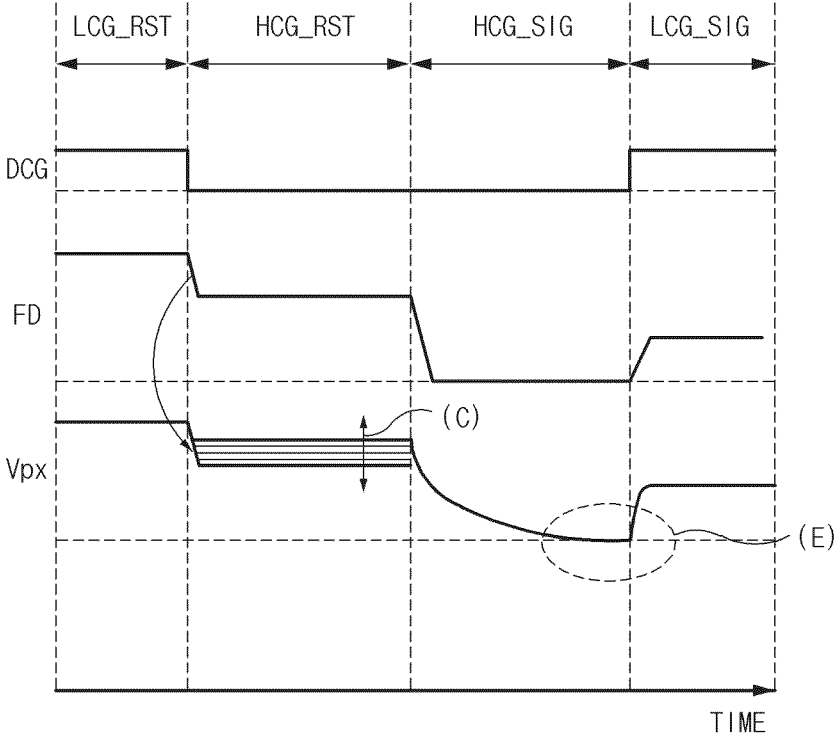
FIGS. 6 and 7 are timing diagrams illustrating operations of the voltage controller shown in FIG. 3 based on some embodiments of the present disclosure.
Figure 7:
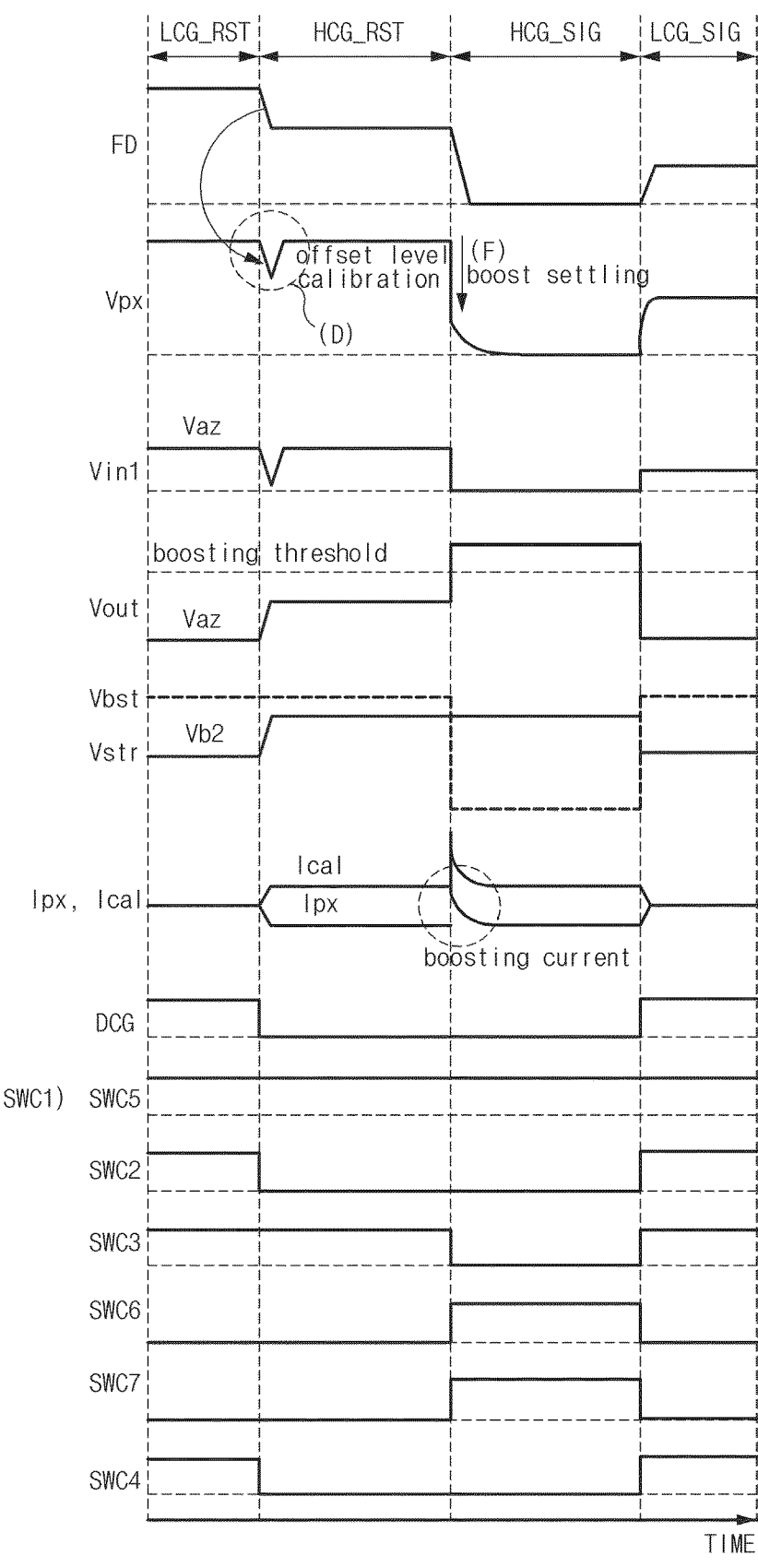

FIGS. 6 and 7 are timing diagrams illustrating operations of the voltage controller 210 shown in FIG. 3 based on some embodiments of the present disclosure. FIG. 6 is a timing diagram illustrating time points of operations generated when the compensation circuit 200 is not applied to the image sensing device 10, and FIG. 7 is a timing diagram illustrating time points of operations generated when the compensation circuit 200 is applied to the image sensing device 10.

In the operation timing diagram of FIG. 7, a section in which each of the switching control signals (SWC1~SWC7) has a logic high level may refer to a time section for controlling the switching elements (SW1~SW7) to be turned on, and another section in which each of the switching control signals (SWC1~SWC7) has a logic low level may refer to a time section for controlling the switching elements (SW1~SW7) to be turned off.

The timing diagrams of FIGS. 6 and 7 may be applied to an operation mode in which a conversion gain of the pixel (PX) is changed using a dual conversion gain (DCG) method. The image sensing device 10 may read out a reset signal and an image signal for each of the LCG mode and the HCG mode during the readout period. The image sensing device 10 may read out a reset signal and an image signal for each of the LCG mode and the HCG mode during a readout period. For example, the image sensing device 10 may acquire LCG pixel data based on an LCG reset signal and an LCG image signal of the pixel (PX), and may acquire HCG pixel data based on an HCG reset signal and an HCG image signal of the pixel (PX).

The readout period of the pixel (PX) may be divided into four sub-sections. The readout operation may be performed in different ways while being classified according to a first reset section (LCG_RST), a second reset section (HCG_RST), a first signal section (HCG_SIG), and a second signal section (LCG_SIG). For example, the image sensing device 10 may acquire the LCG reset signal of the pixel (PX) during the first reset section (LCG_RST), and may acquire the HCG reset signal of the pixel (PX) during the second reset section (HCG_RST). In addition, the image sensing device 10 may acquire the HCG image signal of the pixel (PX) during the first signal section (HCG_SIG), and may acquire the LCG image signal of the pixel (PX) during the second signal section (LCG_SIG). During the readout period, the selection transistor (SX) of the pixel (PX) may remain turned on.

The pixel (PX) may operate in the LCG mode during each of the first reset section (LCG_RST) and the second signal section (LCG_SIG), and may operate in the HCG mode during each of the second reset section (HCG_RST) and the first signal section (HCG_SIG). As shown in FIGS. 6 and 7, the method in which the LCG reset signal, the HCG reset signal, the HCG image signal, and the LCG image signal are sequentially read out during the readout period of the pixel (PX) may be referred to as a reset-reset-signal-signal (RRSS) readout method.

First, in the first reset section (LCG_RST), when the pixel reset signal (RG) of the pixel (PX) is activated, the reset transistor (RX) may be turned on. Also, when the DCG control signal (DCG) of the pixel (PX) is activated, the DCG transistor (DCX) may be turned on. When the reset transistor (RX) and the DCG transistor (DCX) are turned on, the floating diffusion region (FD) of the pixel (PX) may be reset. Then, the sensing voltage ($V_{px}$) corresponding to the LCG reset signal may be output from the pixel (PX) during the first reset section (LCG_RST).

In the first reset section (LCG_RST), since the switching control signals (SWC1~SWC5) are activated, all switching elements (SW1~SW5) may be turned on, and since the switching control signals (SWC6, SWC7) are deactivated, the switching elements (SW6, SW7) may be turned off.

When an auto-zeroing operation is performed in the first reset section (LCG_RST), the input voltage ($V_{in}$) and the drive voltage ($V_{out}$) may be maintained at a voltage level of the auto-zeroing voltage ($V_{az}$). Here, the auto-zeroing operation may be an operation for performing adjustment between a voltage level of a ramp signal (not shown) and a voltage level of a pixel signal to compare the ramp signal and the pixel signal (i.e., the pixel voltage $V_{px}$).

In the first reset section (LCG_RST), the control voltage ($V_{str}$) may be maintained at the bias voltage ($V_{b2}$) level, and the boosting voltage ($V_{bst}$) may be maintained at a voltage (e.g., a power-supply voltage (VDD) level). Accordingly, the current ($I_{px}$) and the current ($I_{cal}$) can be maintained at the same current level.

Thereafter, when the DCG control signal (DCG) is deactivated in the second reset section (HCG_RST), the DCG transistor (DCX) may be turned off. As the DCG transistor (DCX) is turned off in the second reset section (HCG_RST), capacitance of the floating diffusion region (FD) may decrease. Then, the sensing voltage ($V_{px}$) corresponding to the HCG reset signal may be output from the pixel (PX) during the second reset section (HCG_RST).

However, during a predetermined section from a time point where the second reset section (HCG_RST) begins, the sensing voltage ($V_{px}$) may decrease by a specific offset voltage ($V_{off}$) as shown in (C) of FIG. 6. When the DCG transistor (DCX) included in the pixel (PX) transitions from a turned-on state to a turned-off state, a coupling capacitance of the floating diffusion region (FD) may change, so that the voltage of the floating diffusion region (FD) may change accordingly. Since the respective unit pixels (PXs) have different layout environments, the unit pixels (PXs) may have different parasitic capacitances.

Therefore, when the voltage of the floating diffusion region (FD) changes, as shown in (C) of FIG. 6, the sensing voltage ($V_{px}$) output from the pixel (PX) may drop and the offset voltage ($V_{off}$) level may also change. That is, the offset voltage ($V_{off}$) at which the sensing voltage (Vpx) decreases may not be a fixed value. For example, the offset voltage ($V_{off}$) of each pixel (PXs) may have different values depending on the frame of a captured image, the shooting (or photographing) environment, and/or the parasitic capacitance of the pixel (PX).

To compensate for the offset voltage ($V_{off}$) that fluctuates in the image sensing device 10, the image sensing device 10 according to an embodiment of the present disclosure can select an offset adjustment path P1 using the constituent elements of the voltage controller 210 (as shown in FIG. 4) during the second reset section (HCG_RST). When the offset adjustment path P1 is selected, the offset voltage level of the sensing voltage ($V_{px}$) can be compensated as shown in (D) of FIG. 7.

In the second reset section (HCG_RST), the switching control signal (SWC2) may transition to a logic low level. When the switching element (SW2) is turned off and the offset voltage from the transistor (PM1) is transferred through the switching element (SW3), the drive voltage ($V_{out}$) may rise to a predetermined level. Accordingly, the voltage level of the control voltage ($V_{str}$) may be higher than the voltage level of the bias voltage ($V_{b2}$) in response to the increasing drive voltage ($V_{out}$).

When the switching control signal (SWC4) transitions to a logic low level, the switching element (SW4) may be turned off. In this case, when the voltage level of the control voltage ($V_{str}$) increases, the current ($I_{cal}$) may increase by a predetermined level and the current ($I_{px}$) may decrease by a predetermined level. When the value of the current ($I_{px}$) decreases, the sensing voltage ($V_{px}$) increases to a voltage level of the sensing voltage ($V_{px}$) in the first reset section (LCG_RST), so that the voltage level can be compensated.

Subsequently, upon entering the first signal section (HCG_SIG), the transfer transistor (TX) may be turned on. Charges generated by the photodiode (PD) may move to the floating diffusion region (FD) during the section in which the transfer transistor (TX) of the pixel (PX) is turned on. During the first signal section (HCG_SIG), the image sensing device 10 may output the sensing voltage ($V_{px}$) corresponding to the HCG image signal.

In the first signal section (HCG_SIG), the DCG transistor (DCX) maintains a logic low level, so that the pixel (PX) can operate in the HCG mode. In addition, since charges generated by the photodiode (PD) have moved to the floating diffusion region (FD), the pixel (PX) can output the sensing voltage ($V_{px}$) corresponding to the HCG image signal.

However, when the level of the offset voltage ($V_{off}$) is changed as shown in (C) of FIG. 6, the sensing voltage ($V_{px}$) may not be sufficiently boosted and may gradually decrease. Then, as shown in (E) of FIG. 6, the settling time, which is a time taken for the sensing voltage ($V_{px}$) to be settled (or fixed) to a target potential, may increase.

Accordingly, according to the embodiment of the present disclosure, a settling time compensation path (P2) may be selected by the voltage controller 210 as shown in FIG. 5 during the first signal section (HCG SIG). When the settling time compensation path (P2) is selected, the settling time can be reduced by boosting the sensing voltage ($V_{px}$) as shown in (F) of FIG. 7.

In the first signal section (HCG_SIG), the switching control signal (SWC3) may transition to a logic low level, and the switching control signals (SWC6, SWC7) may transition to a logic high level. Then, the switching element (SW3) may be turned off and the switching elements (SW6, SW7) may be turned on. Additionally, the transistors (PM2, NM5) may be driven by the amplified voltage value ($V_{az}+$ $\alpha$sig) received from the transistor (PM1) through the node (N5). Then, the voltage level of the feedback voltage ($V_{fb}$) is reduced by the boosting voltage ($V_{bst}$), so that the current ($I_{cal}$) and the current ($I_{px}$) can be instantaneously boosted. The sensing voltage or the level of the sensing voltage ($V_{px}$) may be boosted based on the instantaneously boosted current ($I_{px}$).

Subsequently, upon entering the second signal section (LCG_SIG), the transfer transistor (TX) may be turned on. In addition, when the DCG control signal (DCG) is activated, the DCG transistor (DCX) may be turned on. Therefore, in the second signal section (LCG_SIG), the pixel (PX) may operate in the LCG mode. As the transfer transistor (TX) is turned on again, charges, that have been generated by the photodiode (PD) but failed to move to the floating diffusion region (FD), may move to the floating diffusion region (FD). As a result, the sensing voltage ($V_{px}$) corresponding to the LCG image signal may be output during the second signal section (LCG_SIG).

In the second signal section (LCG_SIG), the switching control signals (SWC2~SWC4) are activated again, so that all switching elements (SW2~SW4) can be turned on. Then, the switching control signals (SWC6, SWC7) may be deactivated again so that the switching elements (SW6, SW7) may be turned off.

As a result, the input voltage ($V_{in1}$) and the drive voltage ($V_{out}$) can maintain the auto-zeroing voltage ($V_{az}$) level, and the control voltage ($V_{str}$) and the boosting voltage ($V_{bst}$) can maintain the bias voltage ($V_{b2}$) level.

Figure 8:
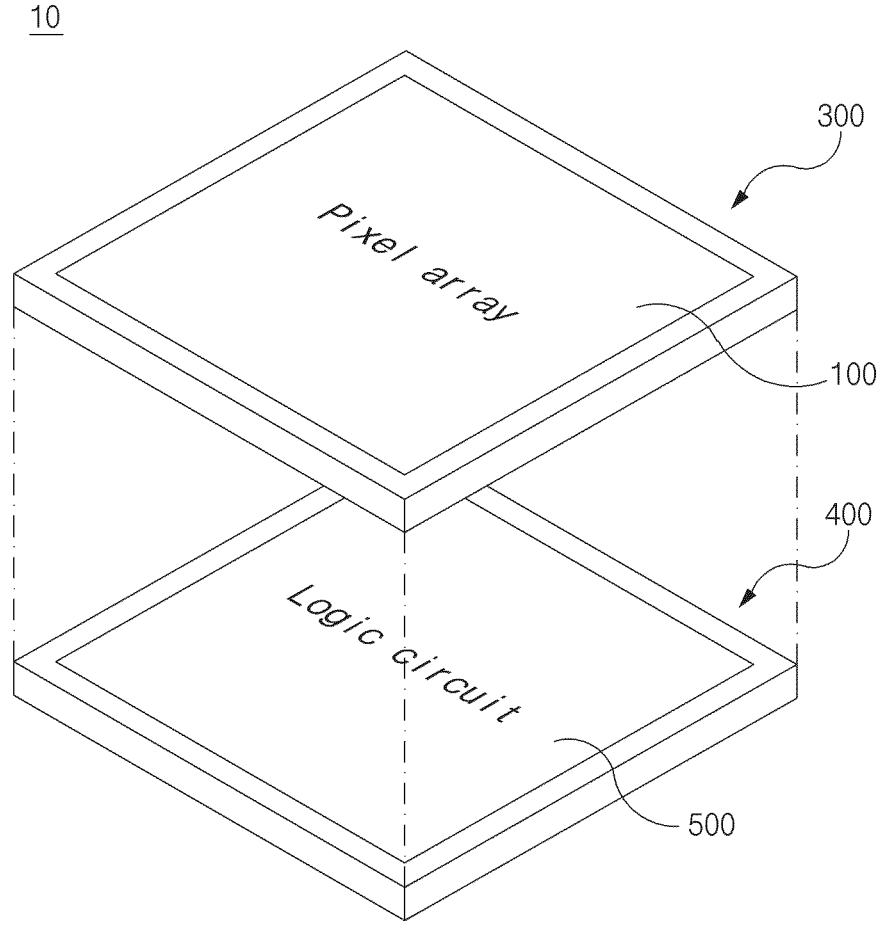
FIG. 8 is a diagram illustrating a stacked structure of the image sensing device shown in FIG. 1 based on some embodiments of the present disclosure.

FIG. 8 is a diagram illustrating a stacked structure of the image sensing device 10 shown in FIG. 1 based on some embodiments of the present disclosure.

Referring to FIG. 8, the image sensing device 10 may include a first chip 300 and a second chip 400. The first chip 300 and the second chip 400 may be vertically bonded to each other, resulting in formation of a stacked structure. The first chip 300 and the second chip 400 may be electrically connected to each other through a connector (not shown), such that signals can be communicated between the first chip 300 and the second chip 400. For example, the first chip 300 and the second chip 400 may be connected to each other through hybrid bonding.

The first chip 300 may include a pixel array 100, and the second chip 400 may include a logic circuit 500. The pixel array 100 may refer to the pixel array 100 shown in FIG. 1, and the plurality of pixels (PXs) may be connected to the logic circuit 500 through a plurality of row lines and a plurality of column lines. The logic circuit 500 may include a row driver 110, a readout circuit 120, a column driver 130, a timing controller 140, etc. required to drive the pixel array 100. The area to be occupied by each of the row driver 110, the readout circuit 120, the column driver 130, and the timing controller 140 within the logic circuit 500, and arrangement shapes of the row driver 110, the readout circuit 120, the column driver 130, and the timing controller 140 within the logic circuit 500 may be modified in various ways.

According to one embodiment, the compensation circuit 200 shown in FIG. 1 may be included in the first chip 300. According to another embodiment, the compensation circuit 200 may be included in the second chip 400. According to still another example, the voltage controller 210 of the compensation circuit 200 may be included in the first chip 300, and the path controller 220 and the bias voltage generator 230 may be included in the second chip 400. In the above embodiments of the present disclosure, the position of the compensation circuit 200 is not limited thereto.

As is apparent from the above description, the image sensing device based on some embodiments of the present disclosure can compensate for an offset voltage, and can acquire a high dynamic range (HDR) image with a reduced settling time.

The embodiments of the present disclosure may provide a variety of effects capable of being directly or indirectly recognized.

Although a number of illustrative embodiments have been described, it should be understood that modifications and enhancements to the disclosed embodiments and other embodiments can be devised based on what is described and/or illustrated in the present disclosure. Furthermore, the embodiments may be combined to form additional embodiments.

What is claimed is:

1. An image sensing device comprising:
a pixel configured to output to a sensing node, a sensing voltage corresponding to a voltage of a floating diffusion region, which is included therein and has first and second capacitances in respective first and second modes, the second capacitance being greater than the first capacitance; and
a compensation circuit configured to:
control, in a first section, an offset voltage level of the sensing node through a first path, and
boost, in a second section, the sensing voltage through a second path.

2. The image sensing device according to claim 1, wherein the compensation circuit includes:
a voltage controller configured to control the offset voltage level when the first path is selected and configured to boost the sensing voltage when the second path is selected;
a path controller configured to control a plurality of switching control signals to select one of the first and second paths; and
a bias voltage generator configured to provide a bias voltage to the voltage controller.

3. The image sensing device according to claim 2, wherein the voltage controller includes:
a bias controller configured to control, based on the bias voltage, a first current running from the sensing node;
a current adjuster configured to control, based on a control voltage, a second current running to a first node;
a drive controller configured to amplify, based on an input voltage, a change in the sensing voltage to provide the amplified change to a second node;
a boosting controller configured to control a boosting signal based on the voltage of the second node; and a plurality of switching elements selectively operable according to the respective switching control signals to select one of the first path and the second path.

4. The image sensing device according to claim 3, wherein the bias controller includes:
a first transistor connected between the sensing node and a third node and configured to receive a first bias voltage through a gate terminal thereof; and
a second transistor connected between the third node and a ground voltage input terminal and configured to receive a second bias voltage through a gate terminal thereof.

5. The image sensing device according to claim 4, wherein the current adjuster includes a third transistor connected between a power-supply voltage input terminal and the first node and configured to receive the control voltage through a gate terminal thereof.

6. The image sensing device according to claim 5, wherein the drive controller includes:
a fourth transistor connected between the power-supply voltage input terminal and the second node and configured to receive the input voltage through a gate terminal thereof; and
a fifth transistor connected between the second node and the ground voltage input terminal and configured to receive a third bias voltage through a gate terminal thereof.

7. The image sensing device according to claim 6, wherein the boosting controller includes:
a sixth transistor connected between the power-supply voltage input terminal and a fourth node and configured to receive the voltage of the second node through a gate terminal thereof; and
a seventh transistor connected between the fourth node and the ground voltage input terminal and configured to receive the voltage of the second node through a gate terminal thereof.

8. The image sensing device according to claim 7, wherein the plurality of switching elements includes:
a first switching element connected between the second node and the gate terminal of the third transistor and operable according to a first switching control signal of the switching control signals;
a second switching element connected between the first node and the fourth node and operable according to a second switching control signal of the switching control signals; and
a third switching element connected between the fourth node and the seventh transistor and operable according to a third switching control signal of the switching control signals.

9. The image sensing device according to claim 8, wherein the first path is selected when the first switching element is turned on and the second and third switching elements are turned off, and
wherein the second path is selected when the first switching element is turned off and the second and third switching elements are turned on.

10. The image sensing device according to claim 9, wherein when the first path is selected:
the fourth transistor is further configured to provide, as the control voltage, a voltage having a higher level than the sensing voltage, and
the current adjuster is further configured to output the second current, which is greater according to the control voltage than according to a preset bias voltage thereby controlling the offset voltage level of the sensing voltage.

11. The image sensing device according to claim 9, wherein when the second path is selected, the fourth transistor is further configured to provide the sixth and seventh transistors with an output voltage having a higher level than the sensing voltage to lower a boosting voltage to have a lower level than a preset bias voltage thereby controlling a voltage level of the first node and boosting the sensing voltage.

12. The image sensing device according to claim 8, wherein the plurality of switching element includes:
a fourth switching element connected between the sensing node and the gate terminal of the fourth transistor and operable according to a fourth switching control signal of the switching control signals;
a fifth switching element connected between the gate terminal of the fourth transistor and the second node and operable according to a fifth switching control signal of the switching control signals;
a sixth switching element connected between the gate terminal of the first transistor and the gate terminal of the third transistor and operable according to a sixth switching control signal of the switching control signals; and
a seventh switching element connected between the third node and the first node and operable according to a seventh switching control signal of the switching control signals.

13. The image sensing device according to claim 12, wherein the voltage controller further includes:
a first capacitor connected between the fourth switching element and the gate terminal of the fourth transistor;
a second capacitor connected between the gate terminal of the third transistor and the first switching element; and
a third capacitor connected between the first node and the second switching element.

14. The image sensing device according to claim 1, wherein:
the first mode is a high conversion gain (HCG) mode in which HCG pixel data is read based on an HCG reset signal and an HCG image signal, and
the second mode is a low conversion gain (LCG) mode in which LCG pixel data is read based on an LCG reset signal and an LCG image signal.

15. The image sensing device according to claim 1, wherein:

the first section is a time section in which a high conversion gain (HCG) reset signal of the pixel is read, and
the second section is a time section in which a high conversion gain (HCG) image signal of the pixel is read.

16. The image sensing device according to claim 1, wherein the pixel further includes a dual conversion gain (DCG) transistor configured to adjust capacitance of the floating diffusion region.

17. An image sensing device comprising:
a pixel configured to output, to a sensing node, a sensing voltage corresponding to a voltage of a floating diffusion region; and
a voltage controller configured to:
control a first current running from the sensing node based on an offset voltage value of the sensing node when a first path is selected in a first section, and
boost the first current when a second path is selected in a second section.

18. The image sensing device according to claim 17, wherein the voltage controller includes:
a bias controller configured to control, based on a bias voltage, the sensing node to have an auto-zeroing voltage level;
a current adjuster configured to adjust the first current based on a control voltage;
a drive controller configured to amplify a change in the sensing voltage based on an input voltage to supply the amplified change as the control voltage;
a boosting controller configured to control, based on the input voltage, a boosting signal for boosting the first current; and
a plurality of switching elements selectively operable according to respective switching control signals to select one of the first path and the second path.

19. The image sensing device according to claim 17, wherein the pixel includes a dual conversion gain (DCG) transistor configured to adjust capacitance of the floating diffusion region.

20. The image sensing device according to claim 17, wherein:
the first section is a time section in which a high conversion gain (HCG) reset signal of the pixel is read, and
the second section is a time section in which a high conversion gain (HCG) image signal of the pixel is read.

* * * * *